United States Patent
Moon et al.

(10) Patent No.: US 11,404,518 B2
(45) Date of Patent: Aug. 2, 2022

(54) DISPLAY PANEL WITH DUMMY PIXELS AND BLACK LINES IN TRANSMISSION AREA

(71) Applicant: Samsung Display Co., Ltd., Yongin-Si (KR)

(72) Inventors: Youngmin Moon, Yongin-si (KR); Jeongkuk Kim, Yongin-si (KR); Kyuhwan Hwang, Yongin-si (KR)

(73) Assignee: Samsung Display Co., Ltd.

( * ) Notice: Subject to any disclaimer, the term of this patent is extended or adjusted under 35 U.S.C. 154(b) by 225 days.

(21) Appl. No.: 16/808,302

(22) Filed: Mar. 3, 2020

(65) Prior Publication Data
US 2021/0013284 A1    Jan. 14, 2021

(30) Foreign Application Priority Data
Jul. 9, 2019    (KR) .......................... 10-2019-0082828

(51) Int. Cl.
*H01L 27/32*    (2006.01)

(52) U.S. Cl.
CPC ...... *H01L 27/3272* (2013.01); *H01L 27/3276* (2013.01)

(58) Field of Classification Search
CPC .................. H01L 27/3272; H01L 27/3276
See application file for complete search history.

(56) References Cited

U.S. PATENT DOCUMENTS

| | | | |
|---|---|---|---|
| 9,299,950 B2 | 3/2016 | Song et al. | |
| 10,230,067 B2 | 3/2019 | Chung et al. | |
| 11,094,772 B2* | 8/2021 | Ma | H04N 5/2257 |
| 2011/0069204 A1* | 3/2011 | Vakrat | H04N 5/3595 |
| | | | 348/234 |
| 2018/0198067 A1 | 7/2018 | Kim et al. | |

FOREIGN PATENT DOCUMENTS

| | | |
|---|---|---|
| KR | 10-2014-0146953 A | 12/2014 |
| KR | 10-2018-0032255 A | 3/2018 |
| KR | 10-2018-0046970 A | 5/2018 |
| KR | 10-2018-0083459 A | 7/2018 |
| KR | 10-2018-0115387 A | 10/2018 |

* cited by examiner

*Primary Examiner* — Lex H Malsawma
(74) *Attorney, Agent, or Firm* — Innovation Counsel LLP

(57) ABSTRACT

A display panel includes a substrate including a display area and a transmission area arranged in the display area which is surrounded by a first side extending in a first direction, a second side extending in a second direction crossing the first direction, a third side facing the first side, and a fourth side facing the second side, pixels arranged in the display area, a first black line extending from the transmission area to the first side in a third direction different from the second direction and arranged with dummy pixels which do not emit light, and a second black line extending from the transmission area to the second side in a fourth direction different from the first direction and arranged with the dummy pixels which do not emit light, wherein the transmission area is arranged closer to the first and second sides than the third and fourth sides.

20 Claims, 13 Drawing Sheets

DISPLAY PANEL WITH DUMMY PIXELS AND BLACK LINES IN TRANSMISSION AREA

CROSS-REFERENCE TO RELATED APPLICATION

This application claims the benefit of Korean Patent Application No. 10-2019-0082828, filed on Jul. 9, 2019, in the Korean Intellectual Property Office, the disclosure of which is incorporated herein in its entirety by reference.

BACKGROUND

1. Field

One or more embodiments relate to a display panel and a display device including the display panel.

2. Description of Related Art

Recently, display devices have been diversified in use. In addition, as the display devices become thinner and lighter, the range of use of the display devices is expanding.

As the display devices are used in various ways, there are various methods of designing the shapes of the display devices. In addition, functions that may be associated or linked to a display device are increasing.

SUMMARY

One or more embodiments include a method of increasing functions that may be associated or linked to a display device, and a display panel having a transmission area in which a camera, a sensor, or the like may be arranged inside a display area and a display device including the display panel. However, the problems are examples and do not limit the scope of the present disclosure.

Additional aspects will be set forth in part in the description which follows and, in part, will be apparent from the description, or may be learned by practice of the presented embodiments of the disclosure.

According to one or more embodiments, a display panel includes a substrate including a display area and a transmission area arranged in the display area, the display area being surrounded by a first side extending in a first direction, a second side extending in a second direction crossing the first direction, a third side facing the first side, and a fourth side facing the second side, pixels arranged in the display area, a first black line extending from the transmission area to the first side in a third direction different from the second direction and arranged with dummy pixels which do not emit light, and a second black line extending from the transmission area to the second side in a fourth direction different from the first direction and arranged with the dummy pixels which do not emit light, wherein the transmission area is arranged closer to the first side than the third side and closer to the second side than the fourth side.

In an embodiment, the third direction may be opposite to the fourth direction.

In an embodiment, widths of the first black line and the second black line may be in a range of about 10 μm to about 70 μm.

In an embodiment, the display panel may further include a third black line extending from the transmission area in a direction to a corner where the first side and the second side meet.

In an embodiment, the display panel may include an opposite electrode corresponding to the pixels, wherein the opposite electrode may have a first opening portion corresponding to the transmission area and a second opening portion corresponding to the dummy pixels.

In an embodiment, wirings connected to the pixels may be provided in the display area, and some of the wirings may be connected to some of the dummy pixels.

In an embodiment, the display panel may further include a fourth black line extending from the transmission area to the first side in the second direction and arranged with the dummy pixels which do not emit light.

In an embodiment, the display panel may further include a fifth black line extending from the transmission area to the second side in the first direction and arranged with the dummy pixels which do not emit light.

In an embodiment, the display panel may further include a first additional black line extending from the transmission area to the first side in a direction parallel to the first black line, wherein at least one pixel may be arranged between the first black line and the first additional black line.

In an embodiment, black lines extending from the transmission area in directions to the third side and the fourth side may not be arranged.

According to one or more embodiments, a display panel includes a substrate including a transmission area, a display area at least partially surrounding the transmission area, and a non-display area outside the display area, pixels arranged in the display area, a plurality of black lines extending from one side of the transmission area to the non-display area and arranged in the display area, and dummy pixels, which do not emit light and correspond to the plurality of black lines, wherein at least one pixel is arranged between adjacent black lines among the plurality of black lines.

In an embodiment, the display area may include a first side extending in a first direction, a second side extending in a second direction crossing the first direction, a third side facing the first side, and a fourth side facing the second side, and the transmission area may be arranged closer to the first side than the third side and closer to the second side than the fourth side.

In an embodiment, the display panel may further include a third black line extending from the transmission area in a direction to a corner where the first side and the second side meet.

In an embodiment, the display panel may further include a fourth black line extending from the transmission area to the first side in the second direction and arranged with the dummy pixels which do not emit light, and a fifth black line extending from the transmission area to the second side in the first direction and arranged with the dummy pixels which do not emit light.

In an embodiment, a width of each of the plurality of black lines may be in a range of about 10 μm to about 70 μm.

In an embodiment, the display panel may include an opposite electrode corresponding to the pixels, wherein the opposite electrode may have a first opening portion corresponding to the transmission area and a second opening portion corresponding to the dummy pixels.

In an embodiment, wirings connected to the pixels may be provided in the display area, and some of the wirings may be connected to some of the dummy pixels.

In an embodiment, the display panel may further include a scan line extending from the display area in a first direction and detouring along an edge of the transmission area, and a data line extending from the display area in a second direction crossing the first direction and detouring along the edge of the transmission area.

In an embodiment, the scan line and the data line may be connected to the dummy pixels.

In an embodiment, the scan line and the data line may include a curved portion around the transmission area.

DETAILED DESCRIPTION

Figure 1:
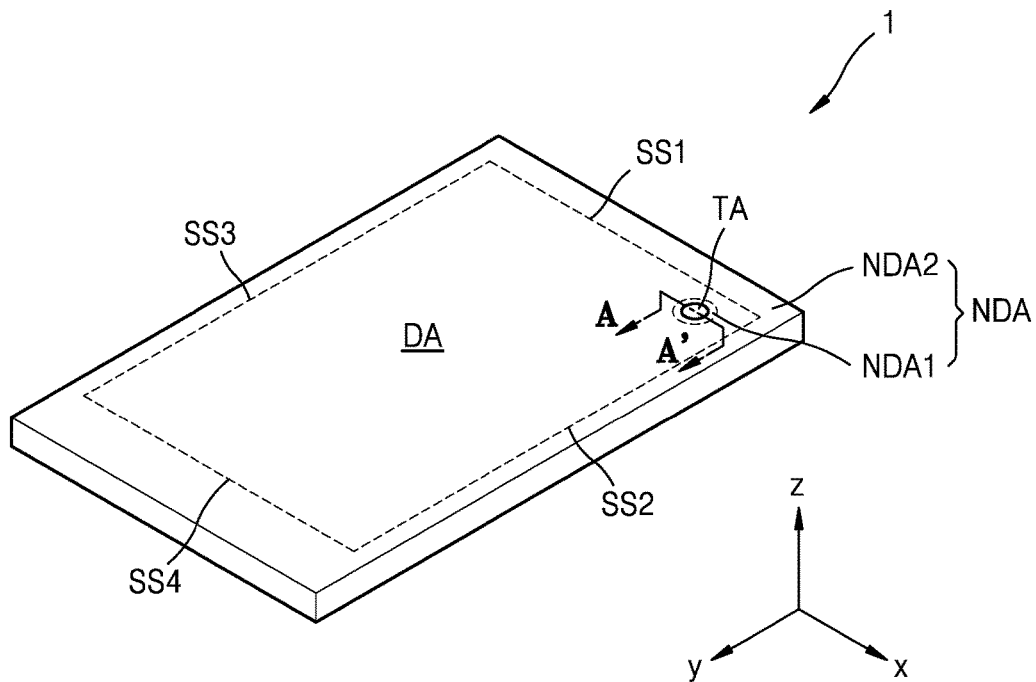
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully with reference to the accompanying drawings, in which exemplary embodiments of the present disclosure are shown. Like reference numerals in the drawings denote like elements, and thus their description will be omitted.

While such terms as "first," "second," etc., may be used to describe various elements, such elements must not be limited to the above terms.

An expression used in the singular encompasses the expression of the plural, unless it has a clearly different meaning in the context.

In the present specification, it is to be understood that the terms such as "including," "having," and "comprising" are intended to indicate the existence of the features, or elements disclosed in the specification, and are not intended to preclude the possibility that one or more other features or elements may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being connected to another layer, region, or component, it can be directly or indirectly connected to the other layer, region, or component. That is, for example, intervening layers, regions, or components may be present. For example, it will be understood that when a layer, region, or component is referred to as being electrically connected to another layer, region, or component, it can be directly or indirectly electrically connected to the other layer, region, or component. That is, for example, intervening layers, regions, or components may be present.

FIG. 1 is a schematic perspective view of a display device 1 according to an embodiment.

Referring to FIG. 1, the display device 1 includes a display area DA which emits light and a non-display area NDA which does not emit light. The display device 1 may provide an image by using light emitted from a plurality of pixels arranged in the display device DA.

The display device 1 includes a transmission area TA. The transmission area TA may be at least partially surrounded by the display area DA. In an embodiment, FIG. 1 illustrates that the transmission area TA is located at an edge of the display area DA and is surrounded by the display area DA.

The display area DA may include an area surrounded by a first side SS1 extending in a first direction x, a second side SS2 extending in a second direction y crossing the first direction x, a third side SS3 facing the first side SS1, and a fourth side SS4 facing the second side SS2.

In this case, as shown in FIG. 1, the transmission area TA may be arranged closer to the first side SS1 than to the third side SS3 and may be arranged closer to the second side SS2 than to the fourth side SS4. However, the arrangement of the transmission area TA is not limited. Alternatively, unlike FIG. 1, the transmission area TA may be arranged closer to the third side SS3 than to the first side SS1 and may be arranged closer to the fourth side SS4 than to the second side SS2. The transmission area TA may be arranged to be biased to one side in the display area DA.

The transmission area TA corresponds to an area through which light and/or sound output from an electronic element to the outside or traveled from the outside toward the electronic element may be transmitted. In an embodiment, when light is transmitted from the transmission area TA, light transmittance may be about 50% or more, more preferably 70% or more, 75% or more, 80% or more, 85% or more, or 90% or more.

The non-display area NDA surrounds the display area DA. A portion of the non-display area NDA is located between the display area DA and the transmission area TA. Hereinafter, for convenience of explanation, an area of the non-display area NDA which surrounds the transmission area TA is referred to as a first non-display area NDA1 and the remaining area is referred to as a second non-display area NDA2.

The first non-display area NDA1 surrounds the transmission area TA, and a portion of the first non-display area NDA1 is located between the display area DA and the transmission area TA. The display area DA entirely surrounds the first non-display area NDA1. In another embodiment, the display area DA partially surrounds the first non-display area NDA1.

The second non-display area NDA2 may extend along the edges of the display device 1, and the first non-display area NDA1 may be connected to the second non-display area NDA2. In other words, the first non-display area NDA1 may entirely surround the transmission area TA, the display area DA may entirely surround the first non-display area NDA1, and the second non-display area NDA2 may entirely surround the display area DA and the first non-display area NDA1.

Hereinafter, although an organic light-emitting display device is described as an example of the display device 1 according to an embodiment, a display device of the present disclosure is not limited. In another embodiment, various types of display devices, such as an inorganic EL display device (inorganic light-emitting display device), a quantum dot light-emitting display device, a liquid crystal display device, or the like, may be used.

Although FIG. 1 illustrates that the transmission area TA is arranged on one side (upper left side) of the display area DA, which is rectangular, the present disclosure is not limited. The display area DA may include a circular shape, an oval shape, or a polygonal shape such as a triangular shape or a pentagonal shape, and the size, shape, number, and position of the transmission area TA may be variously changed.

Figure 2A:
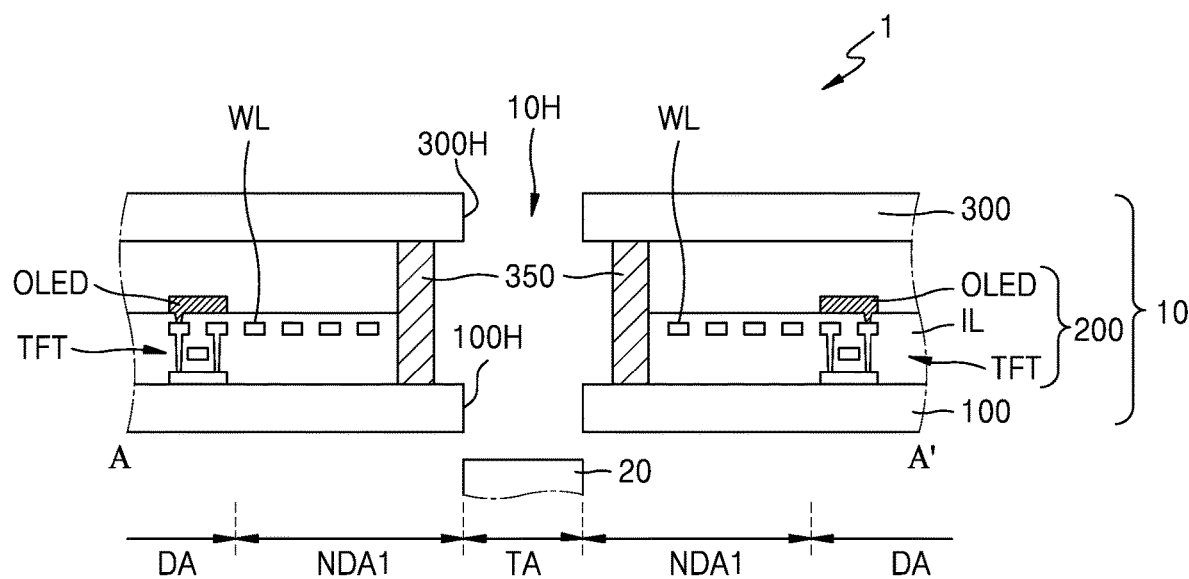
FIGS. 2A, 2B, and 2C are schematic cross-sectional views of the display device according to one or more embodiments.
Figure 2B:
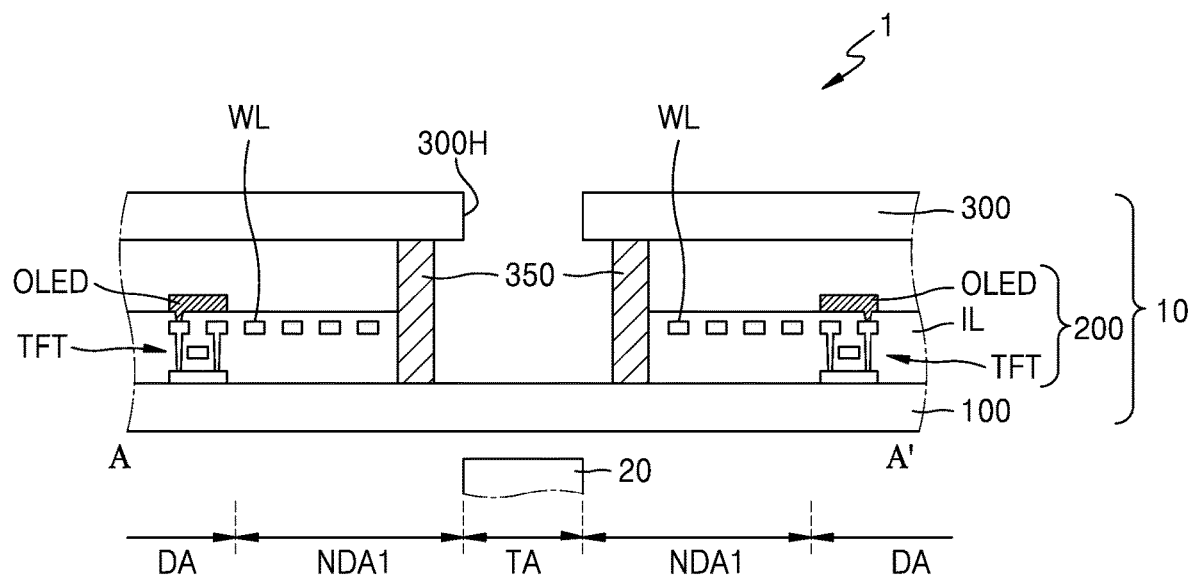
Figure 2C:
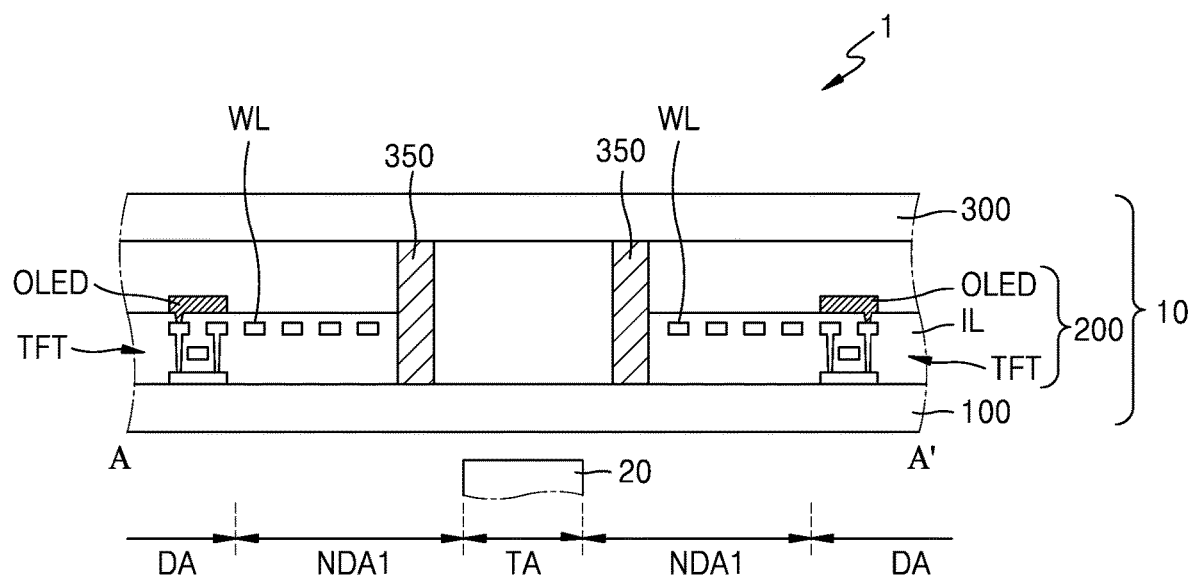

FIGS. 2A, 2B, and 2C are schematic cross-sectional views of the display device 1 according to one or more embodiments, taken along line A-A' in FIG. 1.

Referring to FIG. 2A, the display device 1 may include a display panel 10 including a display element and a component 20 which is corresponding to the transmission area TA.

The display panel 10 may include a substrate 100, an encapsulation substrate 300 as an encapsulation member facing the substrate 100, and a display element layer 200 disposed between the substrate 100 and the encapsulation substrate 300, and a sealing material 350 (i.e., a sealant) covering a side of the display element layer 200 may be arranged between the substrate 100 and the encapsulation substrate 300. Although FIG. 2A illustrates that the sealing material 350 is arranged on both sides of the transmission area TA, the transmission area TA may be understood as being entirely surrounded by the sealing material 350 in a view from a direction perpendicular to a main surface of the substrate 100.

The substrate 100 may include glass or a polymer resin. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 including a polymer resin may be flexible, rollable, or bendable. The substrate 100 may have a multilayer structure including a layer including the above-stated polymer resin and an inorganic layer (not shown). The encapsulation substrate 300 may include glass or the above-stated polymer resin.

The display element layer 200 may include a circuit layer including a thin-film transistor TFT, an organic light-emitting diode OLED as a display element connected to the thin-film transistor TFT, and an insulating layer IL between the thin-film transistor TFT and the organic light-emitting diode OLED. The thin-film transistor TFT and the organic light-emitting diode OLED connected to the thin-film transistor TFT may be arranged in the display area DA, and some wirings WL of the display element layer 200 may be positioned in the first non-display area NDA1. The wirings WL may provide a certain signal or voltage to pixels spaced apart from each other with the transmission area TA between the pixels. Although FIG. 2A illustrates that the wirings WL do not overlap the sealing material 350 in the first non-display area NDA, a portion of the sealing material 350 may also be arranged on the wirings WL in another embodiment.

As depicted in FIG. 2A, the display panel 10 may include a through hole 10H corresponding to the transmission area TA. For example, the substrate 100 and the encapsulation substrate 300 may respectively include a substrate through hole 100H and a encapsulation through hole 300H both corresponding to the transmission area TA. The display element layer 200 may include a through hole corresponding to the transmission area TA.

Although not illustrated in FIG. 2A, components such as an input sensing member sensing a touch input, an anti-reflection member including a polarizer and a retarder or a color filter and a black matrix, and a transparent window may be further arranged above or around the display panel 10.

The component 20 may be located in the transmission area TA. The component 20 may include an electronic element using light or sound. For example, the electronic element may include a sensor receiving and using light, such as an infrared sensor, a camera capturing an image by receiving light, a sensor outputting and sensing light or sound to measure a distance or recognize a fingerprint or the like, a small lamp outputting light, a speaker outputting sound, or the like. The electronic element using light may use light of various wavelengths such as visible light, infrared light, ultraviolet light, or the like. As shown in FIG. 2A, when the display panel 10 includes the through hole 10H corresponding to the transmission area TA, light or sound output or received from the electronic element may be used more effectively.

Unlike the display panel 10 including the through hole 10H corresponding to the transmission area TA in FIG. 2A, some components of the display panel 10 may not include a through hole. For example, as shown in FIG. 2B, although the encapsulation substrate 300 includes the encapsulation through hole 300H corresponding to the transmission area TA, the substrate 100 may not include a through hole. Alternatively, as shown in FIG. 2C, both of the substrate 100 and the encapsulation substrate 300 may not include a through hole corresponding to the transmission area TA. As shown in FIGS. 2B and 2C, even when the substrate 100 does not include the substrate through hole 100H, a portion of the display element layer 200 corresponding to the transmission area TA may be removed to secure a light transmittance for the electronic element. When the display device 1 includes the display panel 10 as shown in FIGS. 2B and 2C, an electronic element using light may be appropriate to use as the electronic element.

As depicted in FIGS. 2A, 2B, and 2C, the component 20 may be positioned outside the through hole 10H. However, the position of the component 20 is not limited. For example, the component 20 shown in FIGS. 2A, 2B, and 2C may be positioned inside the through hole 10H to overlap a side surface of the display panel 10 defining the through hole 10H.

The component 20 may be another member in addition to the above-stated electronic element. In an embodiment, when the display panel 10 is used as a smartwatch or an instrument panel for vehicles, the component 20 may be a member including a clock hand or a needle indicating certain information (for example, the speed of a vehicle or the like), or the like. Alternatively, the component 20 may include components such as an accessory which increases the aesthetics of the display panel 10.

Figure 3A:
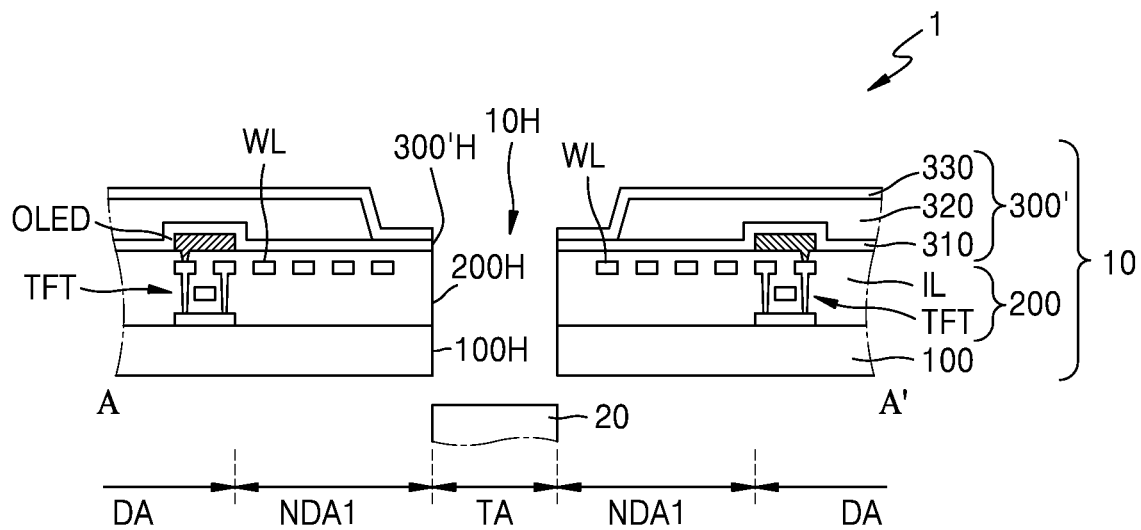
FIGS. 3A, 3B, and 3C are cross-sectional views of the display device according to other embodiments.
Figure 3B:
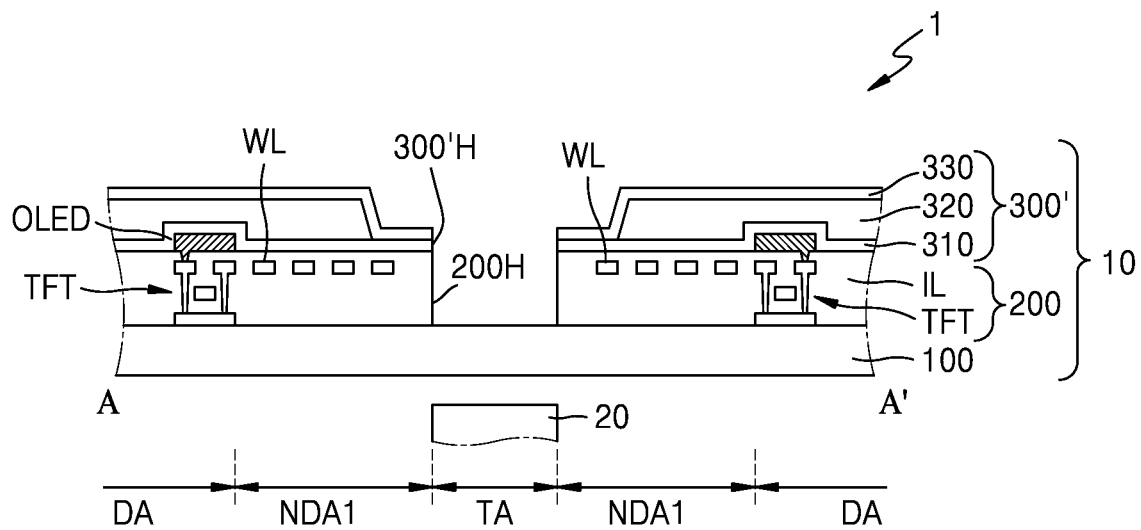
Figure 3C:
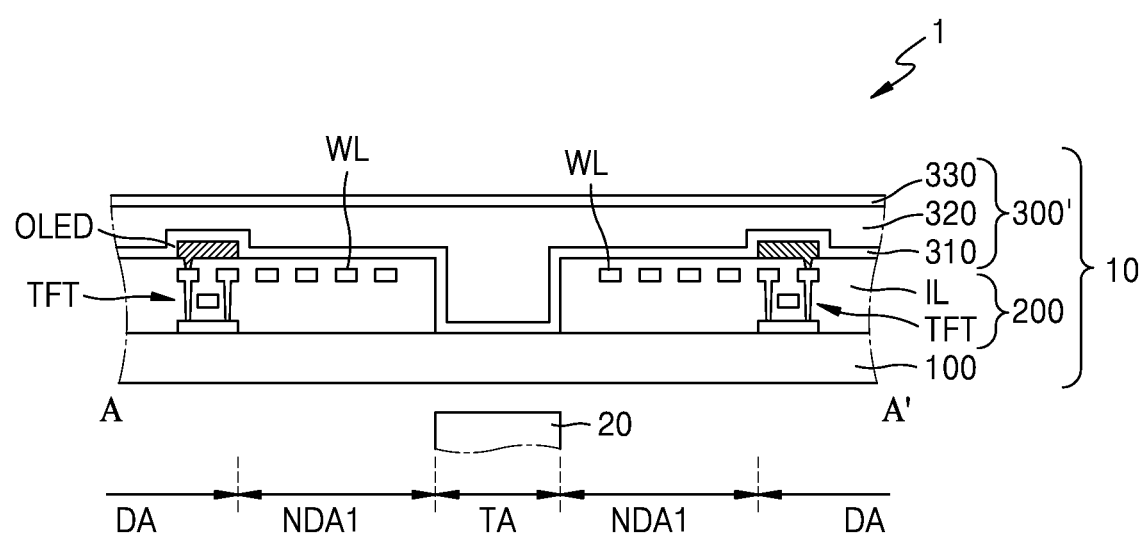

FIGS. 3A, 3B, and 3C are cross-sectional views of the display device 1 according to other embodiments, taken along line A-A' in FIG. 1.

Referring to FIG. 3A, the display device 1 may include the display panel 10 and the component 20 similarly to the display device 1 described with reference to FIG. 2A. In addition, although not illustrated in FIG. 3A, the display device 1 may further include an input sensing member sensing a touch input, an anti-reflection member, a window, or the like, which are arranged above or around the display panel 10.

Unlike the display panel 10 described above with reference to FIG. 2A including the encapsulation substrate 300 as an encapsulation member and the sealing material 350, the display panel 10 according to the present embodiment may include a thin-film encapsulation layer 300' as an encapsulation member. In this case, the flexibility of the display panel 10 may be further improved. Hereinafter, for convenience of explanation, differences between the display panel 10 in FIG. 3A and the display panel 10 in FIG. 2A will be mainly described.

The thin-film encapsulation layer 300' may include at least one inorganic encapsulation layer and at least one organic encapsulation layer. Accordingly, FIG. 3A illustrates first and second inorganic encapsulation layers 310 and 330 and an organic encapsulation layer 320 between the first and second inorganic encapsulation layers 310 and 330.

The first and second inorganic encapsulation layers 310 and 330 may include at least one inorganic insulating material from among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The organic encapsulation layer 320 may include a polymer-based material. The polymer-based material may include an acrylic resin, an epoxy resin, polyimide, polyethylene, or the like.

The display panel 10 may include the through hole 10H corresponding to the transmission area TA. For example, the substrate 100 and the thin-film encapsulation layer 300' may respectively include the substrate through hole 100H and a encapsulation through hole 300'H both corresponding to the transmission area TA. The first and second inorganic encapsulation layers 310 and 330 and the organic encapsulation layer 320 may include a hole corresponding to the transmission area TA. The size of the hole of the organic encapsulation layer 320 may be greater than the sizes of holes of the first and second inorganic encapsulation layers 310 and 330. Accordingly, the first and second inorganic encapsulation layers 310 and 330 may be in contact with each other around the transmission area TA.

Unlike the display panel 10 including the through hole 10H corresponding to the transmission area TA in FIG. 3A, the display panel 10 may not include a through hole. As shown in FIG. 3B, although the thin-film encapsulation layer 300' includes the encapsulation through hole 300H corresponding to the transmission area TA, the substrate 100 may not include a through hole. Alternatively, as shown in FIG. 3C, both of the substrate 100 and the thin-film encapsulation layer 300' may not include a through hole corresponding to the transmission area TA. As shown in FIGS. 3B and 3C, even when the substrate 100 does not include the through hole 100H, a portion of the display element layer 200 corresponding to the transmission area TA may be removed to secure a light transmittance for the electronic element, which is the component 20, as described above.

When the thin-film encapsulation layer 300' does not include a through hole as shown in FIG. 3C, each of at least one inorganic encapsulation layer and at least one organic encapsulation layer may cover the substrate 100 in the transmission area TA. In this case, the portion of the display element layer 200 between the substrate 100 and the thin-film encapsulation layer 300', the portion corresponding to the transmission area TA, may be removed. Although FIG. 3A illustrates that the entire insulating layer IL corresponding to the transmission area TA is removed, only some of the insulating layer IL, which is a multilayer, may be removed.

As depicted in FIGS. 3A, 3B, and 3C, the component 20 may be positioned outside the through hole 10H. However, the position of the component 20 is not limited. The component 20 may be located inside the through hole 10H, for example, inside the through hole 100H of the substrate 100 and the through hole 200H of the display element layer 200, as shown in FIG. 3A, to overlap the side surface of the display panel 10 defining the through hole 10H, or may be located inside the through hole 200H of the display element layer 200, as shown in FIG. 3B.

Although FIGS. 2A, 2B, and 2C illustrate that the display panel 10 includes the encapsulation substrate 300 as an encapsulation member, and FIGS. 3A, 3B, and 3C illustrate that the display panel 10 includes the thin-film encapsulation layer 300' as an encapsulation member, the present disclosure is not limited. For example, the display panel 10 may include any one of the encapsulation substrates 300 shown in FIGS. 2A, 2B, and 2C, and any one of the thin-film encapsulation layers 300' shown in FIGS. 3A, 3B, and 3C.

Figure 4:
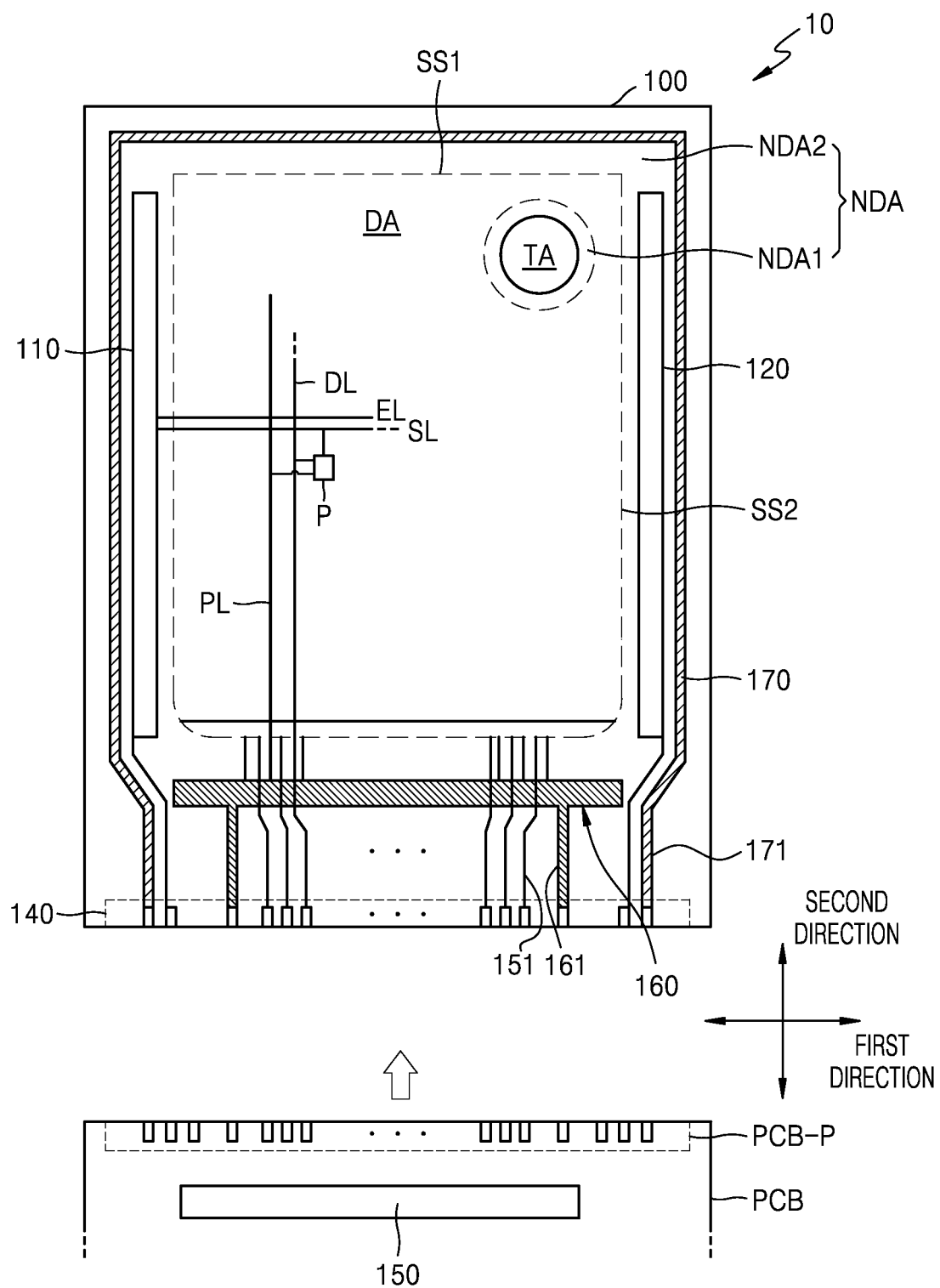
FIG. 4 is a schematic top plan view of the display panel according to an embodiment.

FIG. 4 is a schematic top plan view of the display panel 10 according to an embodiment.

Referring to FIG. 4, the display panel 10 includes a plurality of pixels P arranged in the display area DA. Each of the pixels P may include a display element such as an organic light-emitting diode. Each pixel P may emit red, green, blue, or white light through the organic light-emitting diode. As described above, the pixel P in the present disclosure may be a pixel emitting any one color of red, green, blue, or white light. The display area DA may be covered by the encapsulation member described above with reference to FIGS. 2A, 2B, 2C, 3A, 3B, and 3C to be protected from external air, moisture, or the like.

The transmission area TA may be arranged at edges of the display area DA and may be surrounded by the display area DA. However, the location of the transmission area TA is not limited. For example, unlike FIG. 4, the transmission area TA may be positioned an upper left corner, a bottom right corner, or a bottom left corner of the display area DA. The transmission area TA may be arranged in the display area DA to be adjacent to the first side SS1 and the second side SS2 of the display area DA. Accordingly, the plurality of pixels P is arranged around the transmission area TA. The plurality of pixels P may be arranged to surround at least a portion of the transmission area TA, and the first non-display area NDA1 in which the plurality of pixels P are not arranged is located between the transmission area TA and the display area DA. Wires configured to apply a certain signal or power to the pixels P spaced apart from each other around the transmission area TA may be disposed in the first non-display area NDA1. In addition, some wires may be disconnected by the transmission area TA.

Each pixel P may be electrically connected to outer circuits arranged in the non-display area NDA, for example, the second non-display area NDA2. A first scan driving circuit unit 110, a second scan driving circuit unit 120, a terminal 140, a data driving circuit 150, a first power supply line 160, and a second power supply line 170 are arranged in the second non-display area NDA2.

The first scan driving circuit unit 110 may provide a scan signal to each pixel P through a scan line SL. The first scan driving circuit unit 110 may provide an emission control signal to each pixel P through an emission control line EL. The second scan driving circuit unit 120 may be arranged in parallel with the first scan driving circuit unit 110 with the display area DA between the second scan driving circuit unit 120 and the first scan driving circuit unit 110. Some of the pixels P arranged in the display area DA may be electrically connected to the first scan driving circuit unit 110, and the remaining pixels P may be connected to the second scan driving circuit unit 120.

The terminal 140 may be arranged on one side of the substrate 100. The terminal 140 may be exposed by not being covered by an insulating layer and may be electrically connected to a printed circuit board PCB. A printed circuit board terminal PCB-P of the printed circuit board PCB may be electrically connected to the terminal 140 of the display panel 10. The printed circuit board PCB transmits a signal or power of a controller (not shown) to the display panel 10. Control signals generated by the controller may be respectively transmitted to the first and second scan driving circuit units 110 and 120 through the printed circuit board PCB. The controller may respectively provide a driving voltage and a common voltage (ELVDD and ELVSS in FIGS. 5A and 5B to be described below) to the first and second power supply lines 160 and 170 through first and second connection lines 161 and 171.

The driving voltage ELVDD may be provided to each pixel P through a driving voltage line PL connected to the first power supply line 160, and the common voltage ELVSS may be provided to an opposite electrode of each pixel P connected to the second power supply line 170. The second power supply line 170 may at least partially surround the display area DA in a loop shape of which one side is open.

The data driving circuit 150 is electrically connected to a data line DL. A data signal of the data driving circuit 150 may be provided to each pixel P through a connection line 151 connected to the terminal 140 and the data line DL connected to the connection line 151. Although FIG. 4 illustrates that the data driving circuit 150 is arranged in the printed circuit board PCB, the data driving circuit 150 may be arranged above the substrate 100 in another embodiment. For example, the data driving circuit 150 may be arranged between the terminal 140 and the first power supply line 160.

The first power supply line 160 may be connected to the first connection line 161 to receive the driving voltage ELVDD from the controller connected to the terminal 140. The first power supply line 160 may be arranged to correspond to all columns of the pixels P arranged in a first direction and may transfer the driving voltage ELVDD to each column of the pixel P.

Figure 5A:
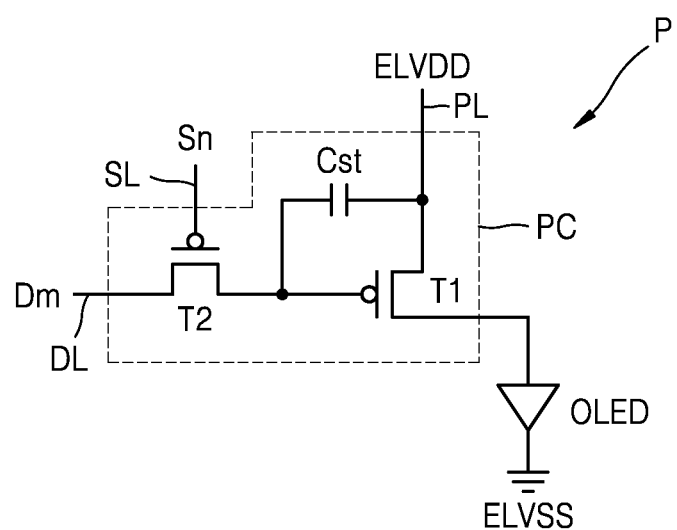
FIGS. 5A and 5B are equivalent circuit diagrams of a pixel in the display panel according to some embodiments.
Figure 5B:
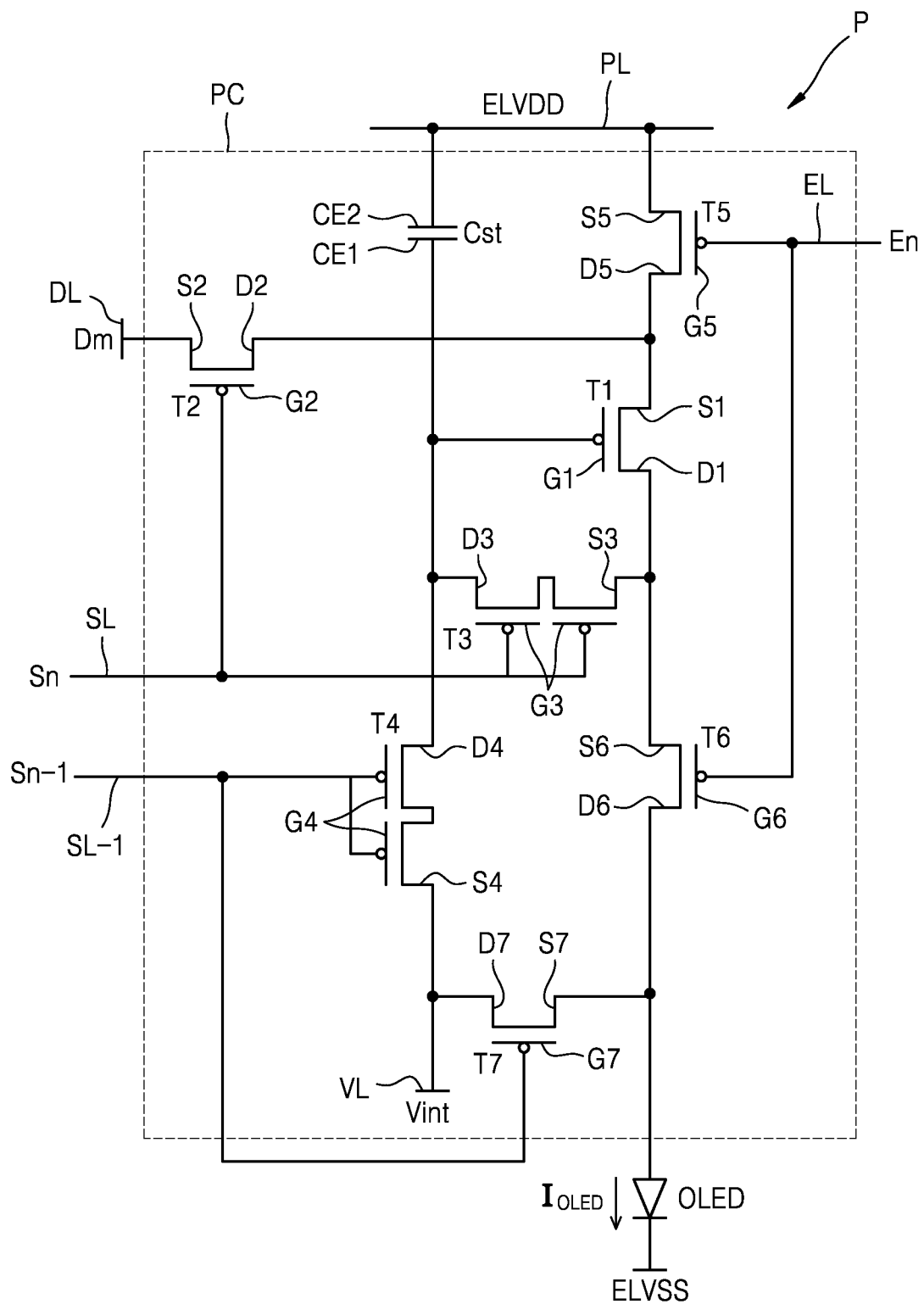

FIGS. 5A and 5B are equivalent circuit diagrams of a pixel in a display panel according to some embodiments.

Referring to FIG. 5A, each pixel P includes the scan line SL, a pixel circuit PC connected to the data line DL, and the organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and delivers, to the driving thin-film transistor T1, a data signal Dm through the data line DL in accordance with a scan signal Sn through the scan line SL.

The storage capacitor Cst is connected to the switching thin-film transistor T2 and a driving voltage line PL and stores a voltage corresponding to a difference between a voltage received from the switching thin-film transistor T2 and the first power supply voltage ELVDD (or the driving voltage) supplied through the driving voltage line PL.

The driving thin-film transistor T1 is connected to the driving voltage line PL and the storage capacitor Cst and controls a driving current flowing from the driving voltage line PL to the organic light-emitting diode OLED in accordance with a voltage value stored in the storage capacitor Cst. The organic light-emitting diode OLED may emit light having a certain brightness in accordance with the driving current.

Although FIG. 5A illustrates that the pixel circuit PC includes two thin-film transistors, the present disclosure is not limited. As shown in FIG. 5B, the pixel circuit PC may include more than two thin-film transistors.

Referring to FIG. 5B, the pixel P includes the pixel circuit PC and the organic light-emitting diode OLED connected to the pixel circuit PC. The pixel circuit PC may include a plurality of thin-film transistors and a storage capacitor. The plurality of thin-film transistors and the storage capacitor may be connected to signal lines SL, SL−1, EL, and DL, an initialization voltage line VL, and the driving voltage line PL.

Although FIG. 5B illustrates that each pixel P is connected to the signal lines SL, SL−1, EL, and DL, the initialization voltage line VL, and the driving voltage line PL, the present disclosure is not limited. In another embodiment, at least one of the signal lines SL, SL−1, EL, and DL, the initialization voltage line VL, the driving voltage line PL, or the like may be shared by neighboring pixels P.

The plurality of thin-film transistors may include a driving thin-film transistor (TFT) T1, a switching TFT T2, a compensation TFT T3, a first initialization TFT T4, an operation control TFT T5, an emission control TFT T6, and a second initialization TFT T7.

The signal lines include a scan line SL transferring a scan signal Sn, a previous scan line SL−1 transferring a previous scan signal Sn−1 to the first initialization TFT T4 and the second initialization TFT T7, an emission control line EL transferring an emission control signal En to the operation control TFT T5 and the emission control TFT T6, and the data line DL crossing the scan line SL and transferring the data signal Dm. The driving voltage line PL transfers the driving voltage ELVDD to the driving TFT T1, and the initialization voltage line VL transfers an initialization voltage Vint to initialize the driving TFT T1 and a pixel electrode of the organic light-emitting diode OLED A driving gate electrode G1 of the driving TFT T1 is connected to a first storage capacitor plate CE1 of the storage capacitor Cst. A driving source electrode S1 of the driving TFT T1 is connected to the driving voltage line PL via the operation control TFT T5. A driving drain electrode D1 of the driving TFT T1 is electrically connected to the pixel electrode of the organic light-emitting diode OLED via the emission control TFT T6. The driving TFT T1 receives the data signal Dm in accordance with a switching operation of the switching TFT T2 and supplies a driving current $I_{OLED}$ to the organic light-emitting diode OLED.

A switching gate electrode G2 of the switching TFT T2 is connected to the scan line SL. A switching source electrode S2 of the switching TFT T2 is connected to the data line DL. A switching drain electrode D2 of the switching TFT T2 is connected to the driving source electrode S1 of the driving TFT T1 and connected to the driving voltage line PL via the operation control TFT T5. The switching TFT T2 is turned on in accordance with the scan signal Sn received through the scan line SL and performs a switching operation of transferring the data signal Dm transferred to the data line DL to the driving source electrode S1 of the driving TFT T1.

A compensation gate electrode G3 of the compensation TFT T3 is connected to the scan line SL. A compensation source electrode S3 of the compensation TFT T3 is connected to the driving drain electrode D1 of the driving TFT T1 and is connected to the pixel electrode of the organic light-emitting diode OLED via the emission control TFT T6. A compensation drain electrode D3 of the compensation TFT T3 is connected to the first storage capacitor plate CE1 of the storage capacitor Cst, a first initialization drain electrode D4 of the first initialization TFT T4, and the driving gate electrode G1 of the driving TFT T1. The compensation TFT T3 is turned on in accordance with the scan signal Sn received through the scan line SL and electrically connects the driving gate electrode G1 to the driving drain electrode D1 of the driving TFT T1 to diode-connect the driving TFT T1.

A first initialization gate electrode G4 of the first initialization TFT T4 is connected to the previous scan line SL−1. A first initialization source electrode S4 of the first initialization TFT T4 is connected to a second initialization drain electrode D7 of the second initialization TFT T7 and the initialization voltage line VL. The first initialization drain electrode D4 of the first initialization TFT T4 is connected to the first storage capacitor plate CE1 of the storage capacitor Cst, the compensation drain electrode D3 of the compensation TFT T3, and the driving gate electrode G1 of the driving TFT T1. The first initialization TFT T4 is turned on in accordance with the previous scan signal Sn−1 received through the previous scan line SL−1 and transfers the initialization voltage Vint to the driving gate electrode G1 of the driving TFT T1 to perform an initialization operation of initializing a voltage of the driving gate electrode G1 of the driving TFT T1.

An operation control gate electrode G5 of the operation control TFT T5 is connected to the emission control line EL. An operation control source electrode S5 of the operation control TFT T5 is connected to the driving voltage line PL. An operation control drain electrode D5 of the operation control TFT T5 is connected to the driving source electrode S1 of the driving TFT T1 and the switching drain electrode D2 of the switching TFT T2.

An emission control gate electrode G6 of the emission control TFT T6 is connected to the emission control line EL. An emission control source electrode S6 of the emission control TFT T6 is connected to the driving drain electrode D1 of the driving TFT T1 and the compensation source electrode S3 of the compensation TFT T3. An emission control drain electrode D6 of the emission control TFT T6 is connected to a second initialization source electrode S7 of the second initialization TFT T7 and the pixel electrode of the organic light-emitting diode OLED.

The operation control TFT T5 and the emission control TFT T6 are simultaneously turned on in accordance with the emission control signal En received through the emission control line EL. Then, the driving voltage ELVDD is transferred to the organic light-emitting diode OLED to allow the driving current $I_{OLED}$ to flow through the organic light-emitting diode OLED.

A second initialization gate electrode G7 of the second initialization TFT T7 is connected to the previous scan line SL−1. The second initialization source electrode S7 of the second initialization TFT T7 is connected to the emission control drain electrode D6 of the emission control TFT T6 and the pixel electrode of the organic light-emitting diode OLED. The second initialization drain electrode D7 of the second initialization TFT T7 is connected to the first initialization source electrode S4 of the first initialization TFT T4 and the initialization voltage line VL. The second initialization TFT T7 is turned on in accordance with the previous scan signal Sn−1 received through the previous scan line SL−1 and initializes the pixel electrode of the organic light-emitting diode OLED.

Although FIG. 5B illustrates that the first initialization TFT T4 and the second initialization TFT T7 are connected to the previous scan line SL−1, the present disclosure is not limited. In another embodiment, the first initialization TFT T4 may be connected to the previous scan line SL−1 and may be driven in accordance with the previous scan signal Sn−1, but the second initialization TFT T7 may be connected to a separate signal line (for example, a following scan line) and may be driven in accordance with a signal transferred to the signal line.

A second storage capacitor plate CE2 of the storage capacitor Cst is connected to the driving voltage line PL, and the opposite electrode of the organic light-emitting diode OLED is connected to the common voltage ELVSS. Accordingly, the organic light-emitting diode OLED may display an image by emitting light by receiving the driving current $I_{OLED}$ from the driving TFT T1.

Although FIG. 5B illustrates that the compensation TFT T3 and the first initialization TFT T4 have dual gate electrodes, the compensation TFT T3 and the first initialization TFT T4 may have one gate electrode respectively.

Figure 6:
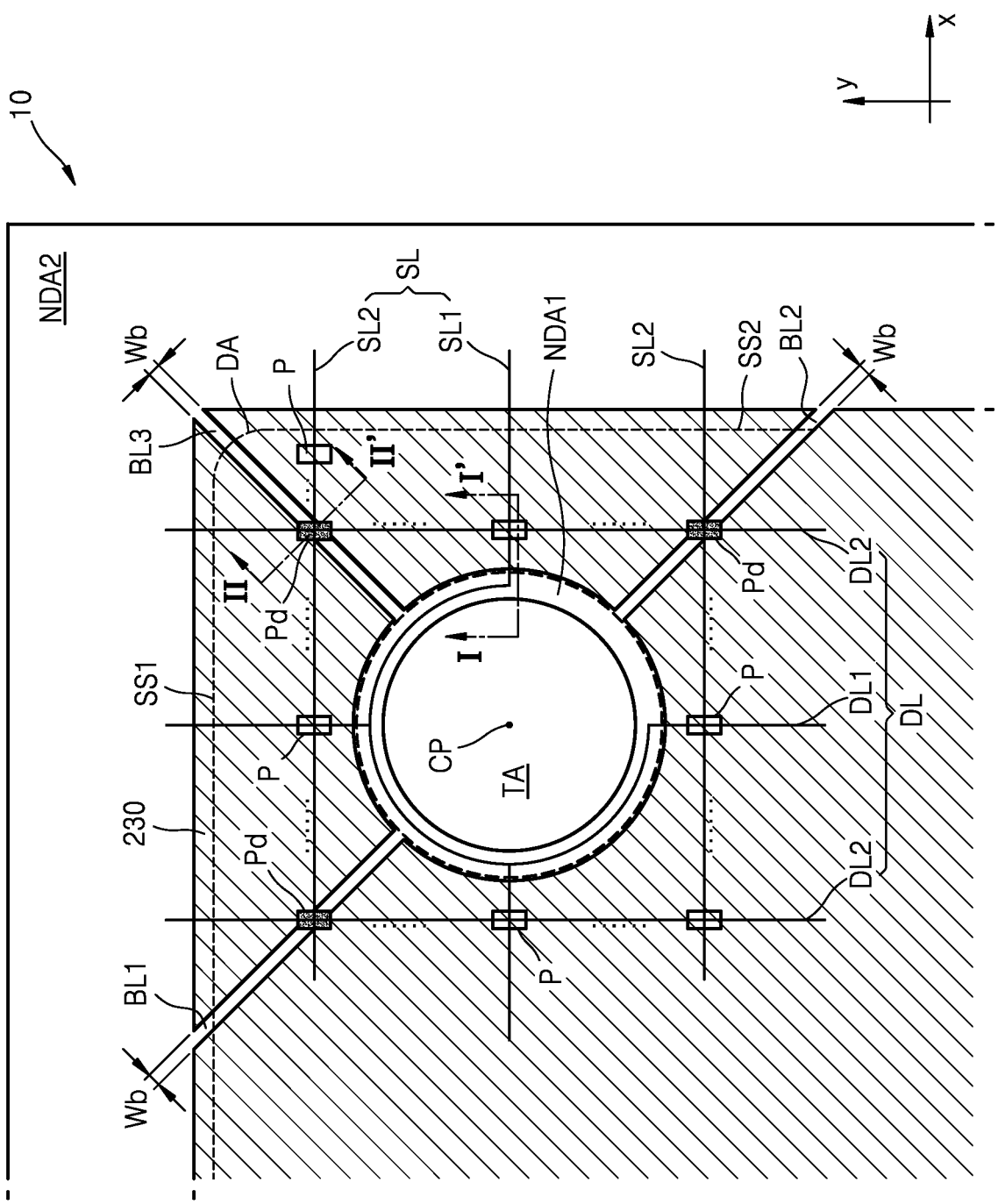
FIG. 6 illustrates relationship between black lines and pixels arranged around a transmission area according to an embodiment.

FIG. 6 illustrates relationship between black lines and pixels arranged around the transmission area TA, in accordance with an embodiment. The black lines indicate a linear area that is arranged inside the display area DA and does not emit light and extends from the transmission area TA to the second non-display area NDA2. The black lines may be an area where the opposite electrode is not formed.

Referring to FIG. 6, the transmission area TA may be arranged adjacent to the first side SS1 and the second side SS2 of the display area DA. The transmission area TA may be arranged in the display area DA, and thus, a plurality of pixels P may be arranged around the transmission area TA. In addition, a wire transferring an electrical signal or a voltage to the plurality of pixels P may be arranged to bypass a periphery of the transmission area TA.

The scan line SL may extend in a first direction x, and the data line DL may extend in a second direction y crossing the scan line SL. The scan line SL may extend in the first direction x and is connected to the plurality of pixels P. The data line DL may extend in the second direction y and is also connected to the plurality of pixels P.

Some scan lines SL may bypass the transmission area TA. In other words, a scan line SL1 adjacent to the transmission area TA may be curved along an edge of the transmission area TA. The curved portion of the scan line SL1 may be arranged in the first non-display area NDA1 around the transmission area TA. The pixels located at left and right sides of the transmission area TA may be electrically connected to each other by the scan line SL1 bypassing the transmission area TA.

Some data lines DL may bypass the transmission area TA. In other words, a data line DL1 adjacent to the transmission area TA may curve along the edge of the transmission area TA. The curved portion of the data line DL1 may be arranged in the first non-display area NDA1 around the transmission area TA. The pixels located above and below the transmission area TA may be electrically connected to each other by the data line DL1 bypassing the transmission area TA.

In the present embodiment, a first black line BL1 and a second black line BL2, which are areas that do not emit light, may be arranged between the transmission area TA and the first side SS1, and between the transmission area TA and the second side SS2. The first side SS1 and the second side SS2 form a periphery of the display area DA respectively. The first black line BL1 may extend in a third direction different from the first direction x and the second direction y. The second black line BL2 may extend in a fourth direction different from the first direction x and the second direction y. In an embodiment, the first black line BL1 and the second black line BL2 may extend in the same third direction. In another embodiment, the first black line BL1 and the second black line BL2 may extend in the same fourth direction. An imaginary line extending from the first black line BL1 and the second black line BL2 may pass through a center point CP of the transmission area TA.

A third black line BL3 extending from transmission area TA to a corner where the first side SS1 and the second side SS2 of the display area DA meet may be further arranged. In addition, additional black lines may be further arranged between the first black line BL1 and the third black line BL3 or between the second black line BL2 and the third black line BL3.

In the present embodiment, the transmission area TA and the first, second, and third black lines BL1, BL2, and BL3 are areas in which the opposite electrode is not formed. A mask M shown in FIG. 7 is used to perform a deposition operation shown in FIG. 8 to form an opposite electrode in a display panel in accordance with the present embodiment.

Figure 7:
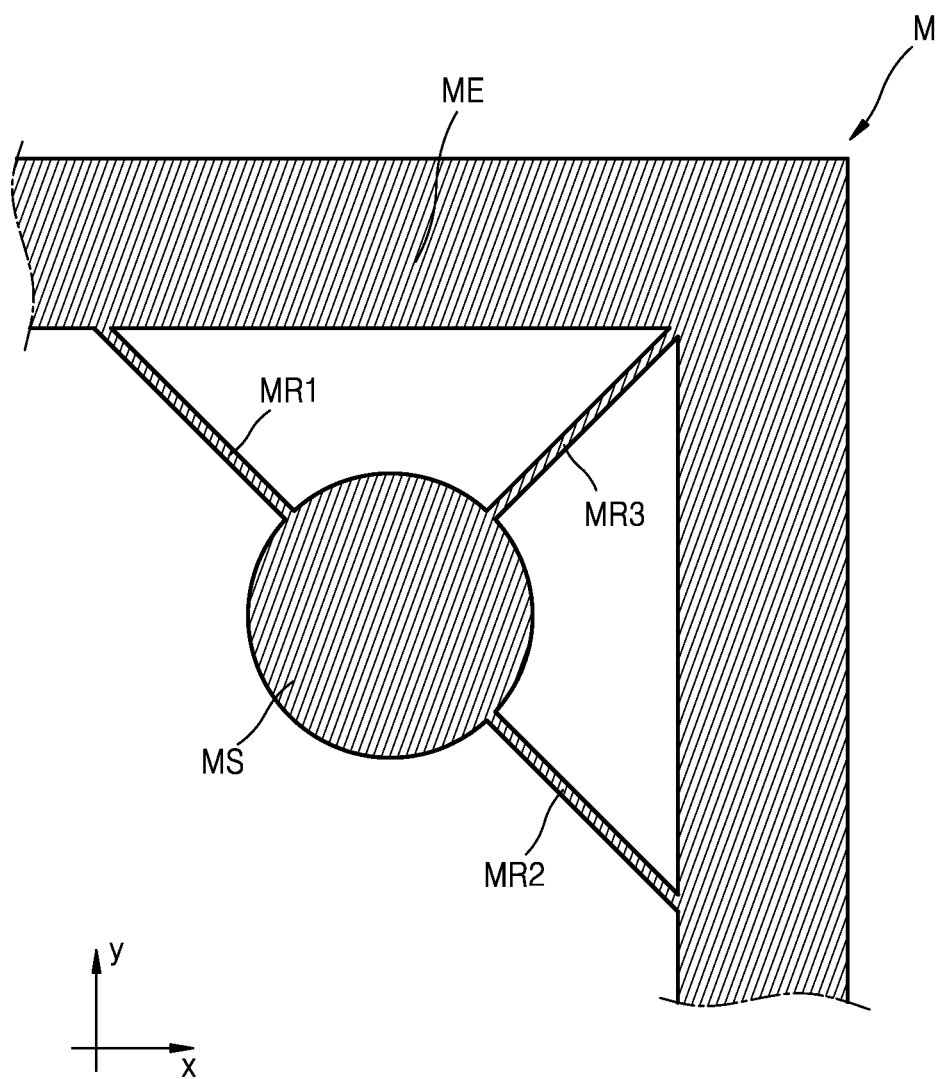
FIG. 7 illustrates an example of a mask used to form the display panel according to an embodiment.

Referring to FIG. 7, the mask M in accordance with an embodiment may include an edge portion ME, a blocking portion MS, and first, second, and third ribs MR1, MR2, and MR3 connecting the edge portion ME to the blocking portion MS to support the blocking portion MS.

The edge portion ME may include a first side and a second side crossing the first side. The blocking portion MS may be arranged adjacent to the first side and the second side of the edge portion ME and may be supported by the first rib MR1 connecting the first side to the blocking portion MS and the second rib MR2 connecting the second side to the blocking portion MS. The third rib MR3 may be further arranged between the blocking portion MS and the edge portion ME. The third rib MR3 may be connected to a corner where the first side and the second side of the edge portion ME meet.

Figure 8:
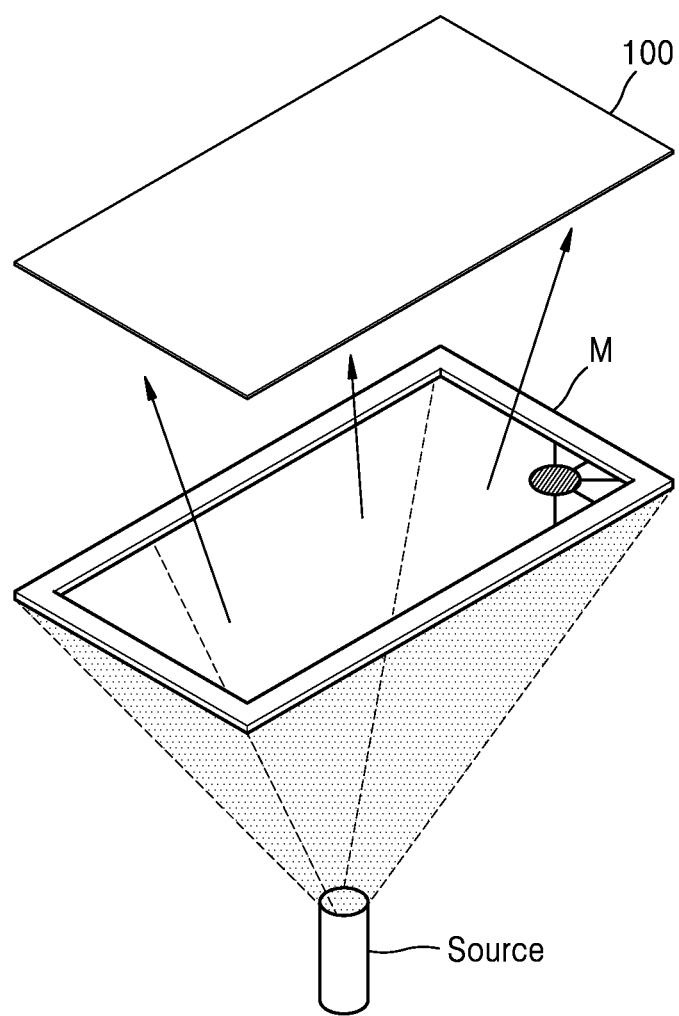
FIG. 8 is a schematic view of a deposition operation of forming an opposite electrode of a the display panel according to an embodiment.

As shown in FIG. 8, when an opposite electrode is deposited, the mask M may be arranged between the substrate 100 and a deposition source to prevent the opposite electrode from being deposited in the transmission area TA.

In other words, the blocking portion MS of the mask M may be arranged to correspond to the transmission area TA of a display panel and the first, second and to third ribs MR1, MR2, and MR3 may be arranged to correspond to the first, second, and to third black lines BL1, BL2, and BL3. In other words, the first rib MR1 may be arranged to correspond to the first black line BL1, and the second rib MR2 may be arranged to correspond to the second black line BL2. In addition, the third rib MR3 may be arranged to correspond to the third black line BL3.

Each of the first, second, and third ribs MR1, MR2, and MR3 may preferably have a width between about 10 μm and about 70 μm. When the widths of the first, second, and third ribs MR1, MR2, and MR3 are 10 μm or less, the first, second, and third ribs MR1, MR2, and MR3 may not support the blocking portion MS. When the widths of the first, second and third ribs MR1, MR2, and MR3 are 70 μm or more, the first to third black lines BL1 to BL3 formed to correspond to the first, second, and third ribs MR1, MR2, and MR3 may be viewed by a user.

Similarly, a width Wb of the first, second, and third black lines BL1, BL2, and BL3 may have a range of about 10 μm to about 70 μm. The width Wb of the first, second, and third black lines BL1, BL2, and BL3 may indicate a length perpendicular to a longitudinal direction in which the first, second, and third black lines BL1, BL2, and BL3 extend from the transmission area TA to the second non-display area NDA2.

When a distance between human eyes and the display panel is about 300 mm, human eyes may view a space between the pixels when a distance between the pixels is about 70 μm or more, and human eyes may not view the space between the pixels when a distance between the pixels is about 70 μm or less. Accordingly, when the width Wb of the first, second, and third black lines BL1, BL2, and BL3 is about 70 μm or less, the user's eyes may not view the first, second, and third black lines BL1, BL2, and BL3 in a general environment.

Referring back to FIG. 6, the display panel 10 in accordance with the present embodiment may include dummy pixels Pd arranged to correspond to the first, second, and third black lines BL1, BL2, and BL3. The dummy pixel Pd may include the same pixel circuit as the pixel P and may be connected to lines such as a scan line and a data line. In other words, the dummy pixel Pd may receive the same electrical signal as the pixel P.

Although FIG. 6 illustrates that one dummy pixel Pd is arranged on the first, second, and third black lines BL1, BL2, and BL3, the present disclosure is not limited. For example, two or more dummy pixels Pd may be arranged on the first, second, and third black lines BL1, BL2, and BL3 respectively.

Figure 9:
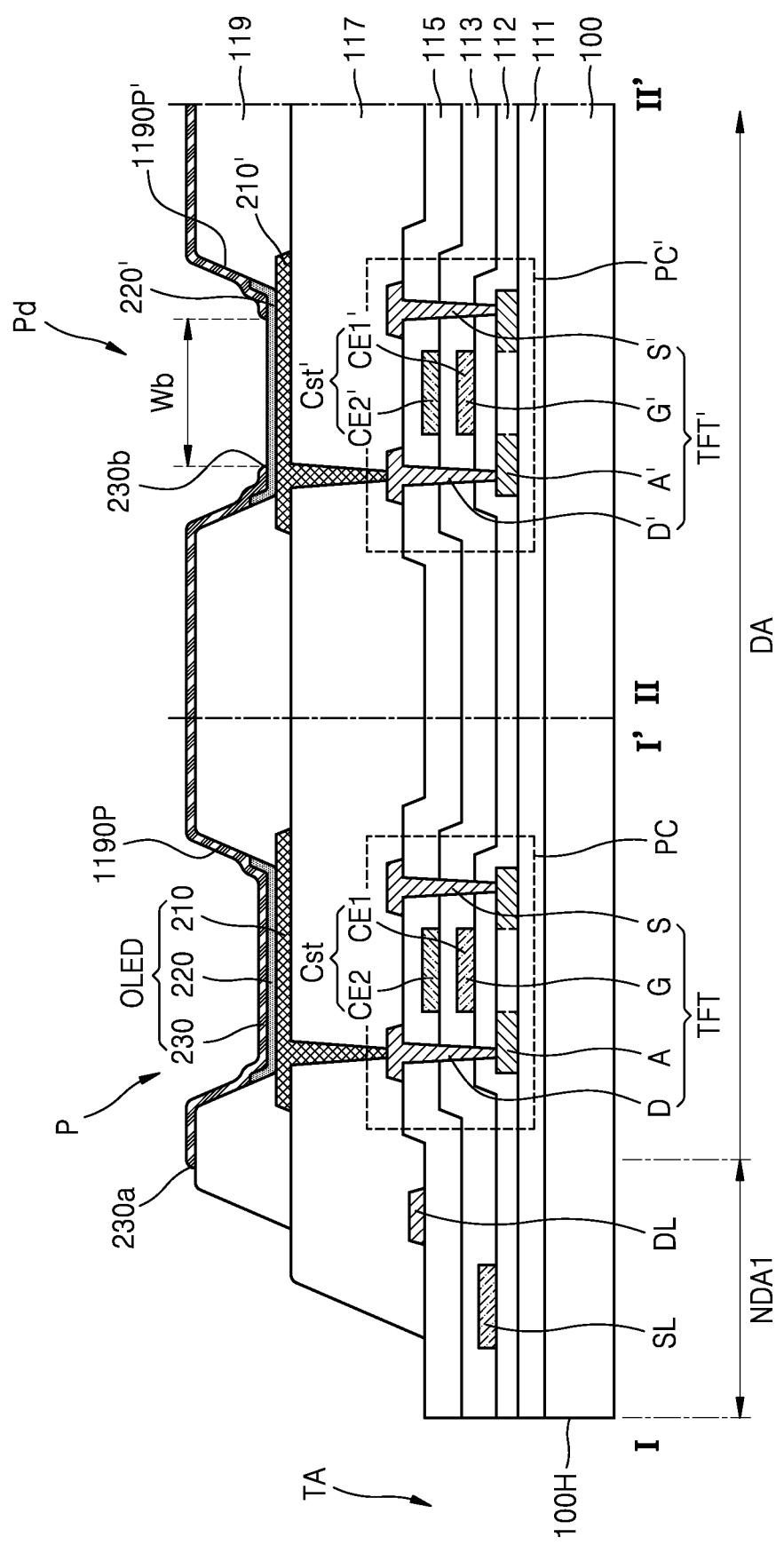
FIG. 9 is a schematic cross-sectional view taken along lines I-I' and II-II' in FIG. 6.

FIG. 9 is a schematic cross-sectional view taken along lines I-I' and II-II' in FIG. 6.

As depicted in FIG. 9, the pixel P may include a pixel circuit PC including at least one thin-film transistor TFT and an organic light-emitting diode OLED as a display element. The dummy pixel Pd may include a dummy pixel circuit PC' including at least one dummy thin-film transistor TFT'. In some embodiments, the pixel circuit PC and the dummy pixel circuit PC' may have the same structure.

In the present embodiment, compared to the pixel P, an opposite electrode 230 of the organic light-emitting diode OLED is not arranged in the dummy pixel Pd, and thus the dummy pixel Pd does not emit light.

Although FIG. 9 illustrates the pixel circuit PC includes only one thin-film transistor TFT and the dummy pixel circuit PC' includes one thin-film transistor TFT', the present disclosure is not limited. A plurality of thin-film transistors TFT and TFT' may be provided, for example, between 2 and 7 thin-film transistors may be provided, and various modifications may be made.

Hereinafter, the structures of the pixel P and the dummy pixel Pd will now be described in a stacking order.

The substrate 100 may include a glass material, a ceramic material, a metal material, or a material having a flexible or bendable characteristic. The substrate 100 may have a single-layer structure or a multilayer structure of the above-described material, and may further include an inorganic layer in the case of a multilayer structure. In some embodiments, the substrate 100 may have a structure of organic/inorganic/organic layer.

Although FIG. 9 illustrates that the substrate 100 has the substrate through hole 100H corresponding to the transmission area TA, the present disclosure is not limited. As shown in FIGS. 2B, 2C, 3B, and 3D, the substrate through hole 100H may not be formed in the substrate 100.

A buffer layer 111 may be located on the substrate 100 to reduce or block infiltration of foreign substances, moisture, or external air from a lower portion of the substrate 100 and may provide a flat surface on the substrate 100. The buffer layer 111 may include an inorganic material such as an oxide or a nitride, an organic material, or an organic and inorganic composite, and may include a single-layer structure or a multilayer structure of an inorganic layer and an organic layer.

A barrier layer (not shown) may be further included between the substrate 100 and the buffer layer 111. The barrier layer may prevent or minimize penetration of impurities from the substrate 100 or the like into semiconductor layers A and A'. The barrier layer may include an inorganic material such as an oxide or a nitride, an organic material, or an organic and inorganic composite, and may include a single-layer structure or a multilayer structure of an inorganic layer and an organic layer.

The semiconductor layers A and A' may be arranged on the buffer layer 111. The semiconductor layers A and A' may include amorphous silicon or polysilicon. In another embodiment, the semiconductor layers A and A' may include an oxide of at least one or more materials selected from a group including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layers A and A' may include a zinc-oxide-based material and may include Zn oxide, In—Zn oxide, Ga—In—Zn oxide, or the like. In another embodiment, the semiconductor layers A and A' may include an In—Ga—Zn—O (IGZO), In—Sn—Zn—O (ITZO), or In—Ga—Sn—Zn—O (IGTZO) semiconductor, which include a metal such as In, Ga, and tin (Sn) in ZnO. The semiconductor layers A and A' may include a channel area and a source area and a drain area arranged on both sides of the channel area. The semiconductor layers A and A' may include a single layer or a multilayer.

Gate electrodes G and G' are arranged above the semiconductor layers A and A' to at least partially overlap the semiconductor layers A and A' with a first gate insulating layer 112 between the gate electrodes G and G' and the semiconductor layers A and A'. The gate electrodes G and G' may include molybdenum (Mo), Al, copper (Cu), Ti, and may include a single layer or a multilayer. In an embodiment, the gate electrodes G and G' may include a single layer of Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) or the like.

A second gate insulating layer 113 may be provided to cover the gate electrodes G and G'. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) or the like.

First storage capacitor plates CE1 and CE1' of storage capacitor Cst and Cst' may overlap the thin-film transistors TFT and TFT'. The gate electrodes G and G' of the thin-film transistors TFT and TFT' may perform functions of the first storage capacitor plates CE1 and CE1' of the storage capacitors Cst and Cst'.

Second storage capacitor plates CE2 and CE2' of the storage capacitors Cst and Cst' overlap the first storage capacitor plates CE1 and CE1' with the second gate insulating layer 113 between the second storage capacitor plates CE2 and CE2' and the first storage capacitor plates CE1 and CE1'. In this case, the second gate insulating layer 113 may perform a function of a dielectric layer of the storage capacitors Cst and Cst'. The second storage capacitor plates CE2 and CE2' may include a conductive material including Mo, Al, Cu, Ti, or the like, and may include a single layer or a multilayer including the above-stated material. In an embodiment, the second storage capacitor plates CE2 and CE2' may include a single layer or Mo or a multilayer of Mo/Al/Mo.

Although FIG. 9 illustrates that the storage capacitors Cst and Cst' overlap the thin-film transistors TFT and TFT', the present disclosure is not limited. Various modifications may be made such that the storage capacitors Cst and Cst' may be arranged to be non-overlapping the thin-film transistors TFT and TFT'.

An interlayer insulating layer 115 may be provided to cover the second storage capacitor plates CE2 and CE2' of the storage capacitors Cst and Cst'. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), or the like.

Source electrodes S and S' and drain electrodes D and D' may be arranged on the interlayer insulating layer 115. The source electrodes S and S' and the drain electrodes D and D' may include a conductive material including Mo, Al, Cu, Ti, or the like, and may include a single layer or a multilayer including the above-stated material. In an embodiment, the source electrodes S and S' and the drain electrodes D and D' may include a multilayer of Ti/Al/Ti.

The organic light-emitting diode OLED may be located in an area of a pixel P on a via layer 117 on the source electrodes S and S' and the drain electrodes D and D'. A dummy pixel electrode 210' and a dummy intermediate layer 220' may be arranged in an area of a dummy pixel Pd on the via layer 117.

The via layer 117 may have a flat surface such that the pixel electrode 210 may be formed flat. The via layer 117 may include a single layer or a multilayer of a film, each including an organic material. The via layer 117 may include benzocyclobutene (BCB), polyimide, hexamethyldisiloxane (HDMSO), a general commercial polymer such as poly (methyl methacrylate) (PMMA) or polystyrene (PS), a polymer derivative having a phenol group, an acrylic polymer, an imide polymer, an aryl ether polymer, an amide polymer, a fluorine polymer, a p-xylene polymer, a vinyl alcohol polymer, and a mixture. The via layer 117 may include an inorganic material. In this case, the via layer 117 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$), or the like. When the via layer 117 includes an inorganic material, a chemical planar polishing may be performed. The via layer 117 may include both of an organic material and an inorganic material.

In the display area DA of the substrate 100, the organic light-emitting diode OLED is arranged on the via layer 117. The organic light-emitting diode OLED includes the pixel electrode 210, an intermediate layer 220 including an organic emission layer, and the opposite electrode 230.

A via hole exposing any one of the source electrode S and the drain electrode D of the thin-film transistor TFT may be provided in the via layer 117 and the pixel electrode 210 contacts the source electrode S or the drain electrode D through the via hole to be electrically connected to the thin-film transistor TFT. Similarly, a via hole exposing any one of the source electrode S' and the drain electrode D' of the thin-film transistor TFT' may be provided in the via layer 117 and the pixel electrode 210' contacts the source electrode S' or the drain electrode D' through the via hole to be electrically connected to the thin-film transistor TFT'.

The pixel electrode 210 and the dummy pixel electrode 210' may include a (semi)transparent electrode or a reflective electrode. In some embodiments, the pixel electrode 210 and the dummy pixel electrode 210' may include a reflective film including silver (Ag), magnesium (Mg), Al, platinum (Pt), palladium (Pd), gold (Au), nickel (Ni), neodymium (Nd), iridium (Ir), chromium (Cr), a compound, or the like, and a transparent or semi-transparent electrode layer formed on the reflective layer. The transparent or semi-transparent electrode layer may include at least one selected from a group including indium tin oxide (ITO), indium zinc oxide (IZO), ZnO, indium oxide (In$_2$O$_3$) indium gallium oxide (IGO), and aluminum zinc oxide (AZO). In some embodiments, the pixel electrode 210 may include a stacked structure with ITO/Ag/ITO.

A pixel defining film 119 may be arranged on the via layer 117 and the pixel defining film 119 may define an emission area of the pixel P by having an opening portion corresponding to each of the pixel electrodes 210 in the display area DA, that is, an opening portion 119OP exposing at least a central portion of the pixel electrode 210. In addition, the pixel defining film 119 increases a distance between an edge of the pixel electrode 210 and the opposite electrode 230 above the pixel electrode 210 to prevent an arc from being generated at the edge of the pixel electrode 210. The pixel defining film 119 may be formed of an organic insulating material such as polyimide, polyamide, acrylic resin, BCB, HMDSO, and phenol resin in a spin coating method or the like.

The pixel P, that is, the emission area of the pixel P may be defined by the opening portion 119OP of the pixel defining film 119. In other words, an edge of the pixel P may indicate an edge of the opening portion 119OP of the pixel defining film 119. In addition, the edge of the opening portion 119OP of the pixel defining film 119 may indicate a boundary at which the pixel electrode 210 is exposed by the opening portion 119OP.

The pixel defining film 119 may further include an opening portion 1119OP' corresponding to the dummy pixel Pd. The opening portion 119OP' may be provided to expose a central portion of the dummy pixel electrode 210'. The dummy intermediate layer 220' may be arranged inside the opening portion 119OP'.

The intermediate layer 220 and the dummy intermediate layer 220' of the organic light-emitting diode OLED may include a low-molecular-weight or a high-molecular-weight material of a polymer material. When the intermediate layer 220 and the dummy intermediate layer 220' of the organic light-emitting diode OLED include a low-molecular-weight material, the intermediate layer 220 and the dummy intermediate layer 220' may include a hole injection layer, a hole transport layer, an emission layer, an electron transport layer, an electron injection layer, or the like having a stacked structure in a single or complex structure, and may include various organic materials including copper phthalocyanine (CuPc), N,N'-Di(naphthalene-1-yl)-N,N'-diphenyl-benzidine (NPB), tris-8-hydroxyquinoline aluminum (Alq$_3$), or the like. The layers may be formed by a method of vacuum deposition.

When the intermediate layer 220 and the dummy intermediate layer 220' of the organic light-emitting diode OLED include a high-molecular-weight polymer material, the intermediate layer 220 and the dummy intermediate layer 220' may have a structure including a hole transport layer and an emission layer. In this case, the hole transport layer may include poly-(3,4)-ethylene-dihydroxy thiophene (PEDOT) and the emission layer may include a polymer material such as polyphenylene vinylene (PPV)-based and polyfluorene-based. The intermediate layer 220 and the dummy intermediate layer 220' may be formed by a screen printing method or an inkjet printing method, a laser-induced thermal imaging method, or the like.

The intermediate layer 220 and the dummy intermediate layer 220' are not limited and may have various structures. The intermediate layer 220 may include a single-body layer over the plurality of pixel electrodes 210 or may include a layer patterned to correspond to each of the pixel electrodes 210.

The opposite electrode 230 may be arranged above the display area DA and may be arranged to cover the display area DA. In other words, the opposite electrode 230 may be formed as a single body with respect to a plurality of organic light-emitting diodes OLED to correspond to the plurality of pixel electrode 210.

The opposite electrode 230 may include a first opening portion 230a corresponding to the transmission area TA and a second opening portion 230b corresponding to the dummy pixel Pd. In other words, the second opening portion 230b of the opposite electrode 230 may be arranged to expose at least a portion of the dummy pixel electrode 210' and the dummy intermediate layer 220' included in the dummy pixel Pd. Accordingly, the dummy pixel Pd may not emit light even when an electrical signal is received. A portion corresponding to an area of the dummy pixel Pd in which the opposite electrode 230 is not arranged may not emit light.

Although FIG. 9 illustrates that the second opening portion 230b is arranged inside the opening portion 119OP' of the pixel defining film 119, the present disclosure is not limited. A width Wb of the second opening portion 230b may be greater than that of the opening portion 119OP' of the pixel defining film 119, and a side surface of the second opening portion 230b may be arranged on an upper surface of the pixel defining film 119. In addition, the second opening portion 230b may have a width corresponding to a plurality of dummy pixels Pd.

The encapsulation substrate 300 and/or the thin-film encapsulation layer 300' described with reference to FIGS. 2A, 2B, 2C, 3A, 3B, and 3C may be arranged above the opposite electrode 230 to protect a display element from the external air.

Figure 10:
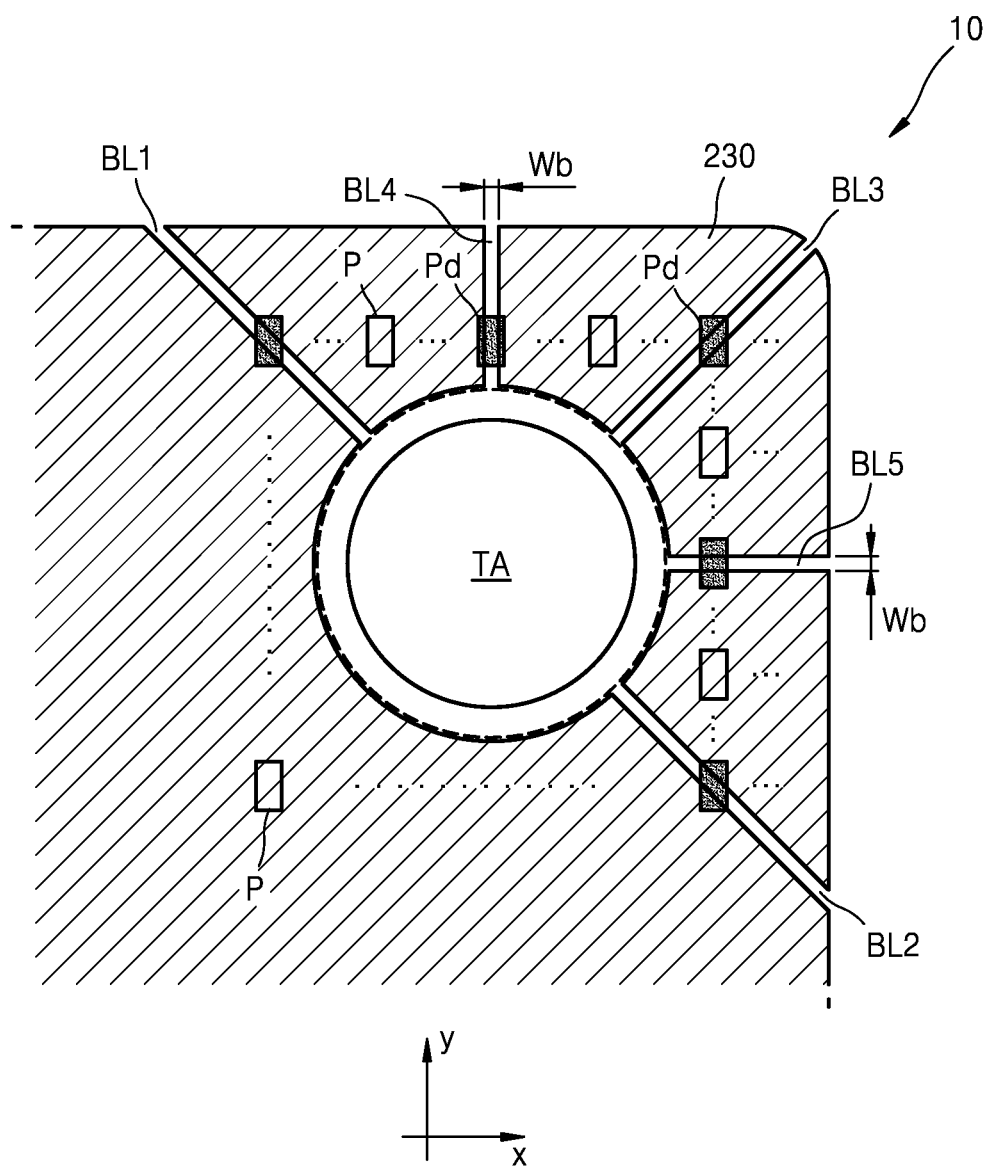
FIG. 10 is a top plan view of a portion of the display panel according to an embodiment.
Figure 11:
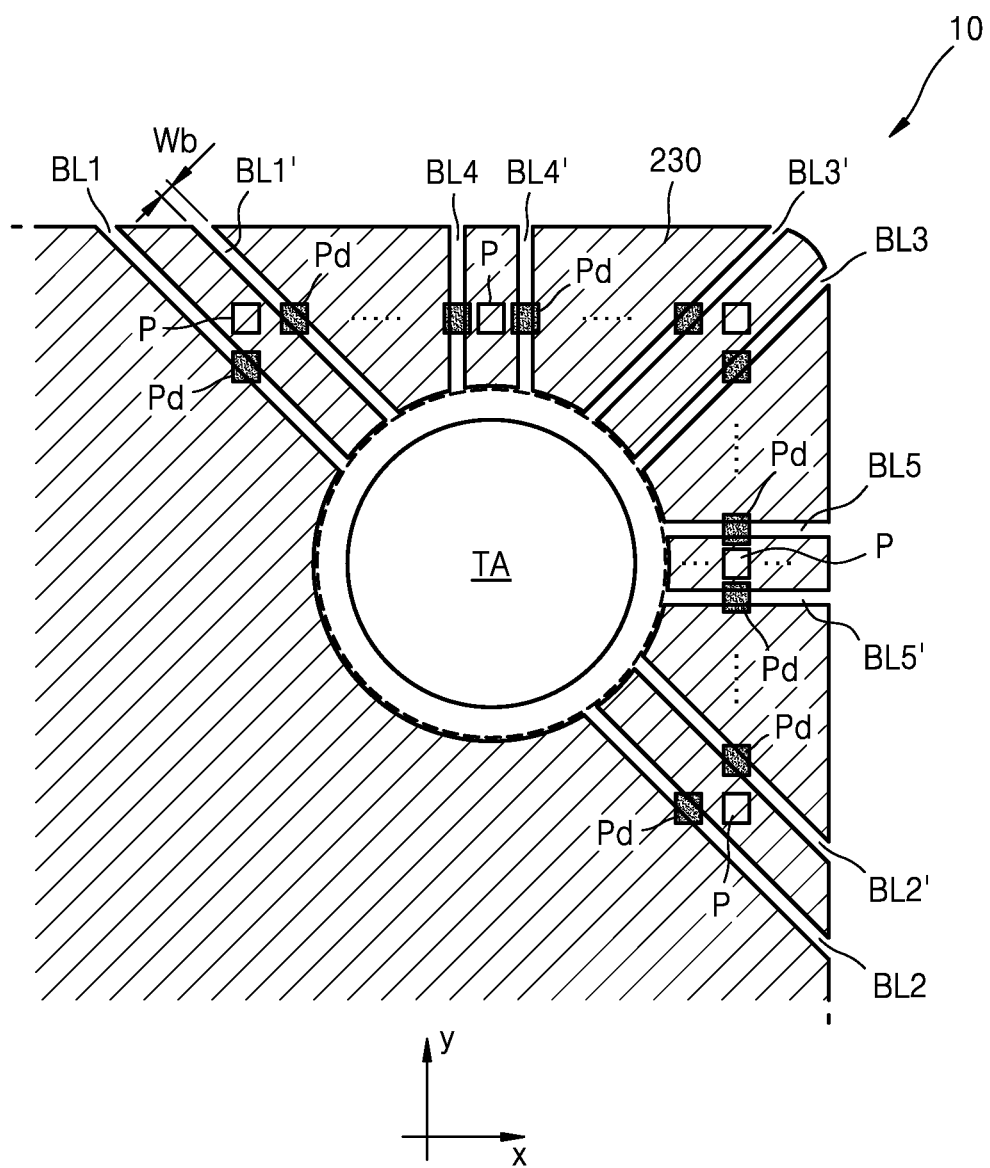
FIG. 11 is a top plan view of a portion of the display panel according to an embodiment.

FIGS. 10 and 11 are schematic diagrams of a portion of a display panel according to another embodiment. In FIGS. 10 and 11, the same reference numerals as those in FIG. 6 refer to the same members, and redundant description thereof will be omitted.

Referring to FIG. 10, in the display panel 10 in accordance with the present embodiment, the transmission area TA is arranged in the display area DA, and the display panel 10 includes the first black line BL1 and the second black line BL2 extending from the transmission area TA to the first side SS1 and to the second side SS2 in the display area DA. In addition, the third black line BL3 extending to a corner where the first side SS1 and the second side SS2 meet may be further provided.

In the present embodiment, a fourth black line BL4 extending from the transmission area TA to the first side SS1 in the second direction y may be further included. In addition, a fifth black line BL5 extending from the transmission area TA to the second side SS2 in the first direction x may be further included.

The fourth black line BL4 and the fifth black line BL5 may be areas where the opposite electrode 230 is not formed. The dummy pixels Pd that do not emit light may be arranged to correspond to the fourth black line BL4 and the fifth black line BL5. At least one pixel P may be arranged in the first, second, third, fourth and fifth black lines BL1, BL2, BL3, BL4, and BL5. An image may be implemented by the pixels P arranged in the first, second, third, fourth, and fifth black lines BL1, BL2, BL3, BL4, and BL5.

A width Wb of each of the first, second, third, fourth, and fifth black lines BL1, BL2, BL3, BL4, and BL5 may be from about 10 µm to about 70 µm. Accordingly, the black lines may not be viewed by the user when using the display panel 10.

Referring to FIG. 11, in the display panel 10 in accordance with the present embodiment, the transmission area TA is arranged in the display area DA, and the display panel 10 includes the first black line BL1 and the second black line BL2 respectively extending from the transmission area TA to the first side SS1 and to the second side SS2 of the display area DA, wherein the first black line BL1 extends in a third direction and the second black line BL2 extends in a fourth direction. The third direction may be opposite to the fourth direction.

In the present embodiment, a first additional black line BL1' extending in a direction parallel to the first black line BL1 may be further included. In this case, the dummy pixel Pd which does not emit light is arranged on the first black line BL1 and the first additional black line BL1' and at least one pixel P, which emits light in accordance with an electrical signal, is arranged between the black line BL1 and the first additional black line BL1'.

In the present embodiment, the fourth black line BL4 extending from the transmission area TA to the first side SS1 in the second direction y may be further included. In addition, the fifth black line BL5 extending from the transmission area TA to the second side SS2 in the first direction x may be further included.

In addition, a second additional black line BL2' parallel to the second black line BL2, a third additional black line BL3' parallel to the third black line BL3, a fourth additional black line BL4' parallel to the fourth black line BL4, and a fifth additional black line BL5' parallel to the fifth black line BL5 may be further included.

At least one pixel P may be arranged in the first, second, third, fourth, and fifth black lines BL1, BL2, BL3, BL4, and BL5 and in the additional first, second, third, fourth, and fifth black lines BL1', BL2', BL3', BL4', and BL5'. An image may be implemented by the pixels P arranged in the first, second, third, fourth, and fifth black lines BL1, BL2, BL3, BL4, and BL5 and the additional first, second, third, fourth, and fifth black lines BL1', BL2', BL3', BL4', and BL5'.

A width Wb of each of the first, second, third, fourth, and fifth black lines BL1, BL2, BL3, BL4, and BL5 and the first, second, third, fourth, and fifth additional black lines BL1', BL2', BL3', BL4', and BL5' may be from about 10 µm to about 70 µm. Accordingly, the black lines may not be viewed by the user when using the display panel.

According to one or more embodiments of the present disclosure, a transmittance may be improved by not forming an opposite electrode in a transmission area corresponding to an electronic element such as a sensor or a camera. However, the effects are illustrative and effects in accordance with the embodiments are described in detail through the description.

Other aspects, features, and advantages other than those described above will now become apparent from the following drawings, claims, and the detailed description of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate including a display area and a transmission area arranged in the display area, the display area being surrounded by a first side extending in a first direction, a second side extending in a second direction crossing the first direction, a third side facing the first side, and a fourth side facing the second side;
   a plurality of pixels arranged in the display area;
   a first black line extending from the transmission area to the first side in a third direction different from the first and second directions and arranged with dummy pixels which do not emit light; and
   a second black line extending from the transmission area to the second side in a fourth direction different from the first and second directions and arranged with the dummy pixels which do not emit light,
   wherein the transmission area is arranged closer to the first side than the third side.

2. The display panel of claim 1, wherein
   the third direction is opposite to the fourth direction.

3. The display panel of claim 1, wherein
   widths of the first black line and the second black line are in a range of about 10 µm to about 70 µm.

4. The display panel of claim 1, further comprising
   a third black line extending from the transmission area in a direction to a corner where the first side and the second side meet.

5. The display panel of claim 1, comprising
   an opposite electrode corresponding to plurality of the pixels, wherein the opposite electrode has a first opening portion corresponding to the transmission area and a second opening portion corresponding to the dummy pixels.

6. The display panel of claim 1, wherein
a plurality of wirings connected to the plurality of pixels are provided in the display area, and
some of the plurality of wirings are connected to some of the of dummy pixels.

7. The display panel of claim 1, further comprising
a fourth black line extending from the transmission area to the first side in the second direction and arranged with the dummy pixels which do not emit light.

8. The display panel of claim 1, further comprising
a fifth black line extending from the transmission area to the second side in the first direction and arranged with the dummy pixels which do not emit light.

9. The display panel of claim 1, further comprising
a first additional black line extending from the transmission area to the first side in a direction parallel to the first black line,
wherein at least one of the plurality of pixels is arranged between the first black line and the first additional black line.

10. The display panel of claim 1, wherein
black lines extending from the transmission area in directions to the third side and the fourth side are not arranged.

11. A display panel comprising:
a substrate including a transmission area, a display area at least partially surrounding the transmission area, and a non-display area outside the display area;
a plurality of pixels arranged in the display area;
a plurality of black lines extending from one side of the transmission area to the non-display area and arranged in the display area; and
a plurality of dummy pixels, which do not emit light and correspond to the plurality of black lines;
wherein at least one pixel is arranged between adjacent black lines among the plurality of black lines, and
wherein the plurality of pixels do not overlap the plurality of black lines.

12. The display panel of claim 11, wherein
the display area comprises a first side extending in a first direction, a second side extending in a second direction crossing the first direction, a third side facing the first side, and a fourth side facing the second side, and
the transmission area is arranged closer to the first and second sides than the third and fourth sides.

13. The display panel of claim 12, further comprising
a third black line extending from the transmission area in a direction to a corner where the first side and the second side meet.

14. The display panel of claim 12, further comprising
a fourth black line extending from the transmission area to the first side in the second direction and arranged with the dummy pixels which do not emit light, and
a fifth black line extending from the transmission area to the second side in the first direction and arranged with the plurality of dummy pixels which do not emit light.

15. The display panel of claim 11, wherein
a width of each of the plurality of black lines is in a range of about 10 μm to about 70 μm.

16. The display panel of claim 11, comprising
an opposite electrode corresponding to the plurality of pixels, wherein the opposite electrode has a first opening portion corresponding to the transmission area and a second opening portion corresponding to the plurality of dummy pixels.

17. The display panel of claim 11, wherein
a plurality of wirings connected to the plurality of pixels are provided in the display area and some of the plurality of wirings are connected to some of the plurality of dummy pixels.

18. The display panel of claim 11, further comprising
a plurality of scan lines extending from the display area in a first direction and at least one of the plurality of scan lines detouring along an edge of the transmission area, and
a plurality of data lines extending from the display area in a second direction crossing the first direction and at least one of the plurality of data lines detouring along the edge of the transmission area.

19. The display panel of claim 18, wherein
the plurality of scan lines and the plurality of data lines are connected to the plurality of dummy pixels.

20. The display panel of claim 18, wherein
At least some of the plurality of scan lines and at least some of the plurality data lines comprise a curved portion around the transmission area.

* * * * *